United States Patent [19]
Rinderer

[11] Patent Number: 6,065,612
[45] Date of Patent: May 23, 2000

[54] RELAY RACK WITH TWO-WAY OPENING DOOR FRAME

[75] Inventor: Eric R. Rinderer, Highland, Ill.

[73] Assignee: Sigma Aldrich Co., Highland, Ill.

[21] Appl. No.: 09/298,396

[22] Filed: Apr. 23, 1999

[51] Int. Cl.[7] .................................................. A47F 5/00
[52] U.S. Cl. ........................ 211/26; 211/175; 211/189; 312/265.1; 361/829; 49/193
[58] Field of Search ........................... 211/26, 189, 175; 312/265.1, 265.2, 265.3, 265.4; 361/829, 683, 724; 49/193

[56] References Cited

U.S. PATENT DOCUMENTS

| | | | |
|---|---|---|---|
| 3,889,419 | 6/1975 | Maleck | 49/193 |
| 4,171,052 | 10/1979 | Winn | 211/162 |
| 4,503,582 | 3/1985 | Gurubatham | 16/232 |
| 4,553,674 | 11/1985 | Yoshikawa et al. | 211/26 |
| 4,611,866 | 9/1986 | Everett | 312/257 |
| 4,811,518 | 3/1989 | Ladisa | 49/193 |
| 5,148,629 | 9/1992 | Minami | 49/193 |
| 5,307,942 | 5/1994 | Quelfeter et al. | 211/26 |
| 5,407,263 | 4/1995 | Jones et al. | 312/265.6 |
| 5,417,012 | 5/1995 | Brightman et al. | 49/382 |
| 5,540,339 | 7/1996 | Lerman | 211/26 |
| 5,542,549 | 8/1996 | Siemon et al. | 211/26 |
| 5,548,927 | 8/1996 | Song | 49/193 |
| 5,765,698 | 6/1998 | Bullivant | 211/26 |
| 5,806,687 | 9/1998 | Ballesteros et al. | 211/26 |
| 5,829,197 | 11/1998 | Oh | 49/193 |
| 6,000,771 | 12/1999 | Wissinger et al. | 49/193 X |
| 6,006,925 | 12/1999 | Sevier | 211/26 |

OTHER PUBLICATIONS

Informational Flyer from PFT—A Zero Corporation Company, dated May 1997.

*Primary Examiner*—Robert W. Gibson, Jr.
*Attorney, Agent, or Firm*—Senniger, Powers, Leavitt & Roedel

[57] ABSTRACT

A relay rack for supporting electronic components having a swinging door frame with a simple mechanism for selectively opening either left or right hand sides of the door frame while preventing inadvertent simultaneous release of both sides. The relay rack comprises a top frame, a bottom frame, a rectangular door frame, and four pivot pins on the door frame. Recesses in the top and bottom frames receive the pivot pins. Latching bars are mounted to the top and bottom frames for sliding movement to the left and to the right relative to the frames for holding or releasing the pivot pins from the recesses so the door frame can be swung open and closed about either a left or right vertical pivot axis. The top and bottom frames are releasably fastened to the back frame to permit removal and replacement by different top and bottom frames whereby a front-to-back dimension of the rack may be readily changed without replacing the back frame or the door frame.

14 Claims, 12 Drawing Sheets

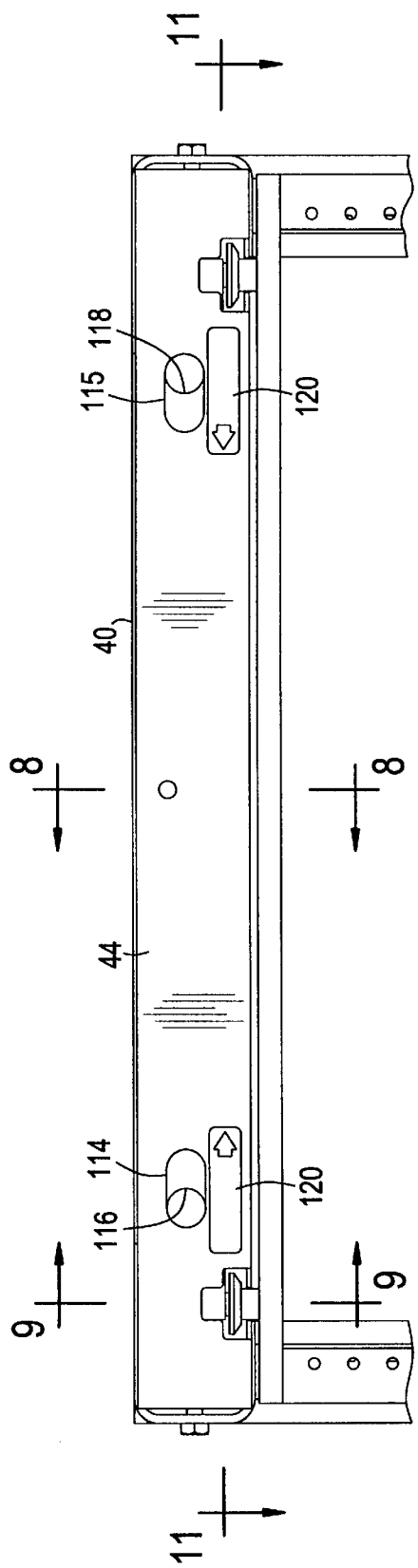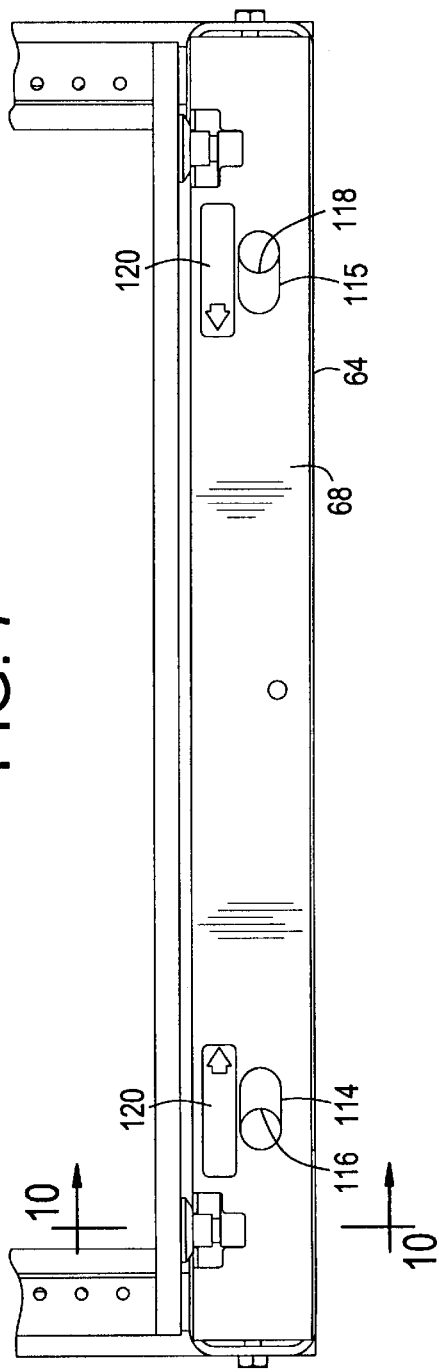

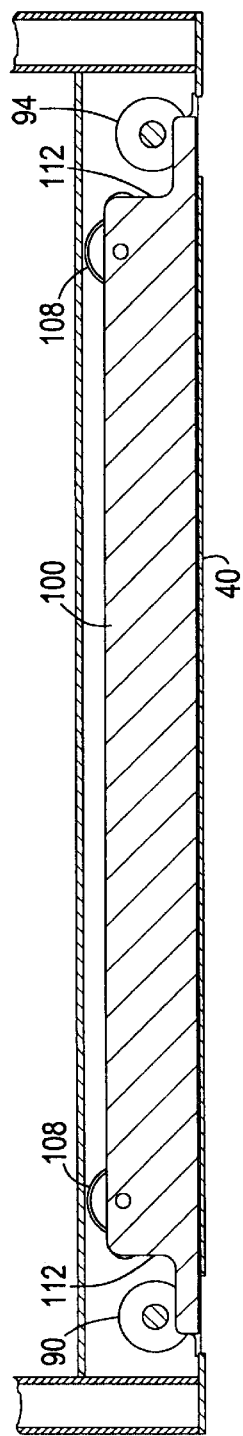
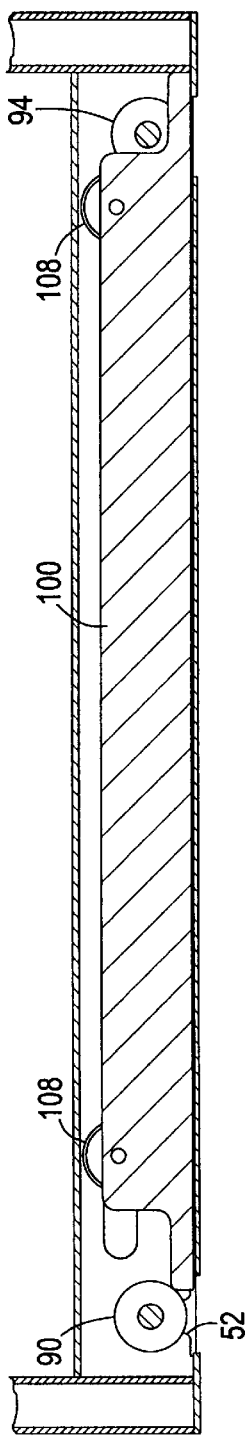
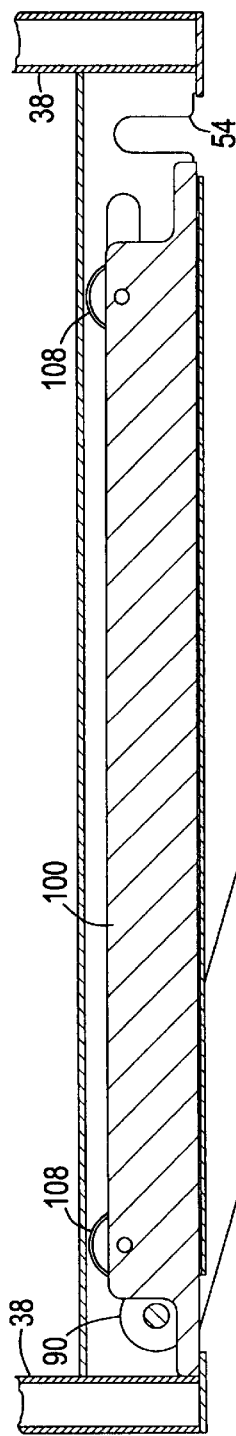
FIG. 11
FIG. 12
FIG. 13

RELAY RACK WITH TWO-WAY OPENING DOOR FRAME

BACKGROUND OF THE INVENTION

This invention relates generally to support racks for mounting electronic equipment, and in particular to a relay rack with a swinging door frame that may be opened from either the left or right hand side, and a rack which further can be selectively altered in depth without dismounting the equipment.

A rack for electronic components is frequently used with various types of computer and telecommunications equipment to support, organize, and protect the components. Each rack typically has a swinging gate or door frame that pivotally opens like a door to provide access to the components for purposes of repair or modification. Ideally, every electronic component, wherever it is mounted on the rack, may be easily reached after opening the door frame. Unfortunately, it may be difficult to reach all components, or it may be necessary to dismount some equipment in order to access hard-to-reach areas. For instance, components near a left hand side of the rack may be significantly obscured by wiring or other components when a door frame swings open exclusively from a right hand side. Further, it can be difficult to swing the door frame completely open when a rack is installed in a relatively tight place, located closely adjacent to equipment or walls that block the door frame from swinging open in one direction, thus limiting the freedom to place the rack in any desired location.

A useful feature for improving accessibility to electronic components is a door frame that may be swung open from either the left or right hand side. This flexibility permits greater access to electronic components in the rack. Further, a two-way opening door frame permits greater freedom to place the rack in any desired location with lesser regard to nearby obstructions. Since either side may open, an obstruction that blocks a door frame from swinging fully open in one direction is of lesser importance, since swinging is unlimited in the other direction.

A drawback to prior racks having two-way opening door frames is that such racks are often complex in design. Typically, these door frames require several moving parts such as levers and latches to mechanize a pivotal motion about either of two vertical axes. Also, complex safety devices are typically included to prevent both sides of the door frame from being inadvertently unlatched at the same time, which could result in the door frame falling off the rack. These mechanisms add cost and increase likelihood of mechanical failure.

Thus there is a need for a relay rack that incorporates a door frame which may be swung open from either the left or right hand side while preventing accidental detachment of the door frame from the rack, and that has a reliable mechanism that minimizes moveable parts and reduces complexity.

In another aspect, relay racks of the prior art are not easily expandable in size or capacity. When a need arises for more capability, racks are often wholly replaced by larger racks. That necessitates a process that typically includes disconnecting all of the electronics mounted on the rack, replacing the rack and associated wall attachments, and reconnecting the electronics on a larger rack. The process takes much time, and meanwhile operation of the electronic equipment is interrupted. Thus there is a need for a process for efficiently expanding the capacity of a relay rack without disconnecting any electronics.

SUMMARY OF THE INVENTION

Among the several objects and features of the present invention may be noted the provision of a relay rack for supporting electronic components and having a door frame that can be selectively opened from either the left or the right; the provision of such a rack that prevents accidental simultaneous release of both left and right hand sides of the door frame from the rack; the provision of such a rack having a simple mechanism that is reliable in operation and minimizes the number of moving parts for economical manufacture; and the provision of a rack which is constructed so that its depth may be readily changed without disconnecting the electronic components supported by the rack; and a method for changing the depth of a rack without disconnecting such electronic components.

In general, a relay rack of the present invention comprises a top frame and a bottom frame. The top frame comprises a top front frame member and the bottom frame comprises a bottom front frame member. A generally rectangular door frame comprises a top door frame member, a bottom door frame member and a pair of upright side door frame members adjacent left and right sides of the door frame. Upper and lower left pivot pins on the top and bottom door frame members define a left vertical pivot axis generally adjacent the left side of the door frame, and upper and lower right pivot pins on the top and bottom frame members of the door frame define a right vertical pivot axis generally adjacent the right side of the door frame. Upper and lower left recesses in the top and bottom frame members receive the upper and lower left pivot pins, and upper and lower right recesses in the top and bottom frame members receive the upper and lower right pivot pins. An upper latching bar mounted to the rear of the top front frame member slidingly moves to the left and to the right relative to the top front frame member, and a lower latching bar mounted immediately to the rear of the bottom front frame member slidingly moves to the left and to the right relative to the bottom front frame member. The upper and lower latching bars are slidable from a home position in which they hold the left and right pivot pins captive in their respective recesses to lock the door closed, to a left position in which the latching bars release the right pivot pins from their respective right recesses so the door frame can be swung open and closed about the left vertical pivot axis, and to a right position in which the latching bars release the left pivot pins from their respective left recesses so the door frame can be swung open and closed about the right vertical pivot axis.

In another aspect, a relay rack of the general type described above further comprises an upright back frame. The top frame and the bottom frame each are generally U-shaped and extend forward from the back frame. The top frame comprises left and right top side frame members extending forward from the back frame and connected at forward ends thereof by the top front frame member. The bottom frame comprises left and right bottom side frame members extending forward from the back frame and connected at forward ends thereof by the bottom front frame member. A front-to-back dimension, constituting a depth of the rack, is determined by a length of the left and right side frame members of the top and bottom frames. The top and bottom frames are releasably fastened to the back frame to permit removal and replacement by different top and bottom frames having left and right side frame members of a selected length whereby the depth of the rack may be readily changed without replacing the back frame or the door frame.

Another aspect of this invention involves a method of changing the depth of a wall-mounted relay rack of the type described above without disconnecting wiring of system components carried by the rack. The method comprises the steps of removing the door frame without disconnecting the wiring and without removing the back frame from the wall, placing the removed door frame in a position adjacent the rack, as permitted by the wiring, and removing the top and bottom frames from the back frame. Replacement top and bottom frames having side frame members of a length corresponding to a desired new depth of the rack are then attached to the back frame, following which the door frame is remounted on the replacement top and bottom frames.

Other objects and features of the present invention will be in part apparent and in part pointed out hereinafter.

BRIEF DESCRIPTION OF THE DRAWINGS

FIG. 6 is a fragmentary elevational view of the relay rack showing a top front frame member of the top frame; FIG. 7 is a fragmentary elevational view of the relay rack showing a bottom front frame member of the bottom frame;

FIG. 11 is a sectional plan view taken on line 11—11 of FIG. 6 and illustrating an upper latching bar in a home or neutral position in which left and right pivot pins are held captive in their respective recesses;

FIG. 12 is a view similar to FIG. 11 showing the upper latching bar in a right position;

FIG. 13 is a view similar to FIG. 11 showing the upper latching bar in a left position and the door frame swung open about the left vertical pivot axis;

Corresponding reference characters indicate corresponding parts throughout the views of the drawings.

DETAILED DESCRIPTION OF THE PREFERRED EMBODIMENT

Figure 1:
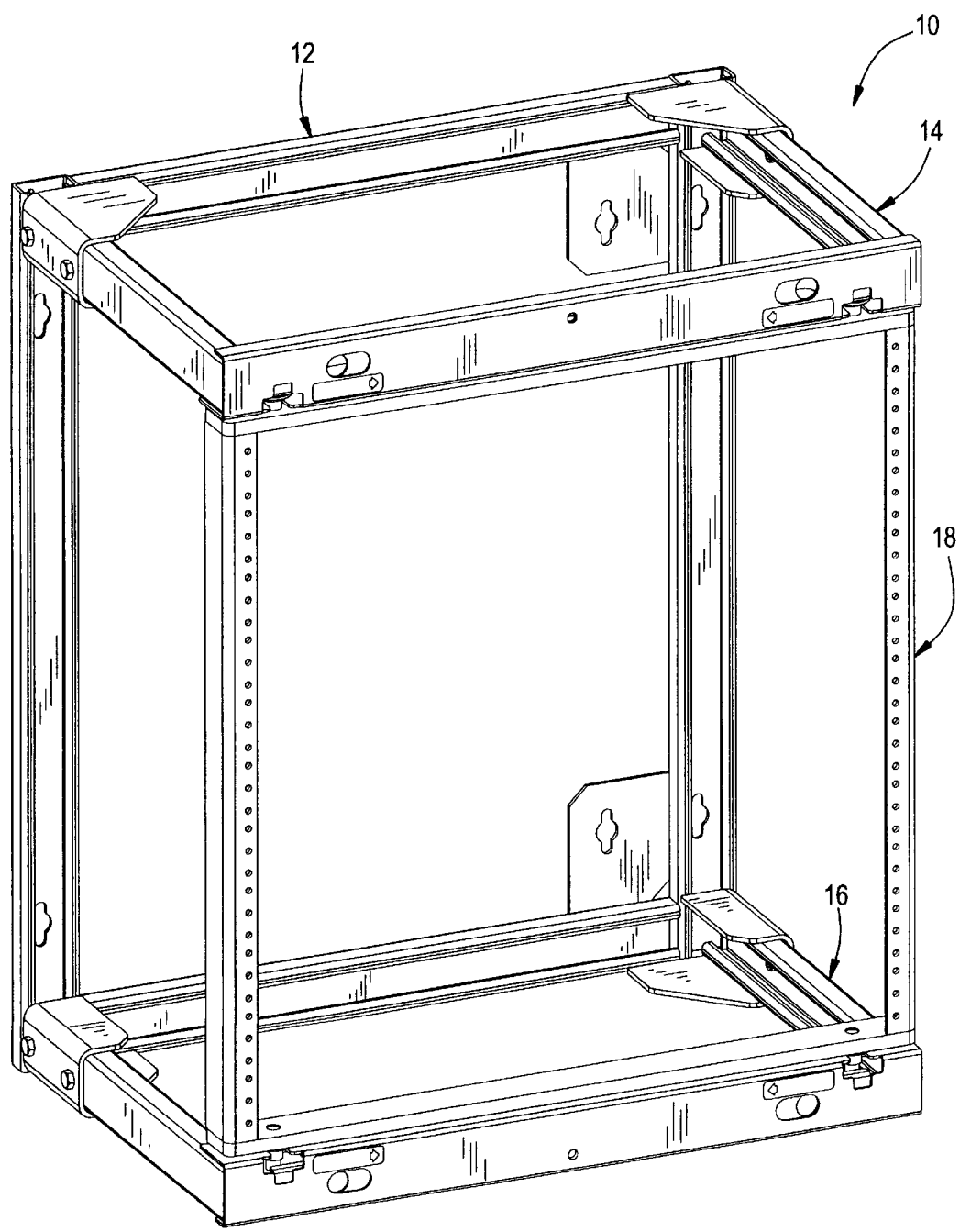
FIG. 1 is a perspective view of a relay rack with a swinging door frame of the present invention, the door frame shown being shown in a closed position.

Referring now to the drawings and in particular to FIG. 1, a relay rack of the present invention is indicated generally by the reference numeral 10. The rack 10 comprises an assembly of several frames, including a back frame generally designated 12, generally U-shaped top and bottom frames generally designated 14 and 16, respectively, and a door frame generally designated 18.

Figure 2:
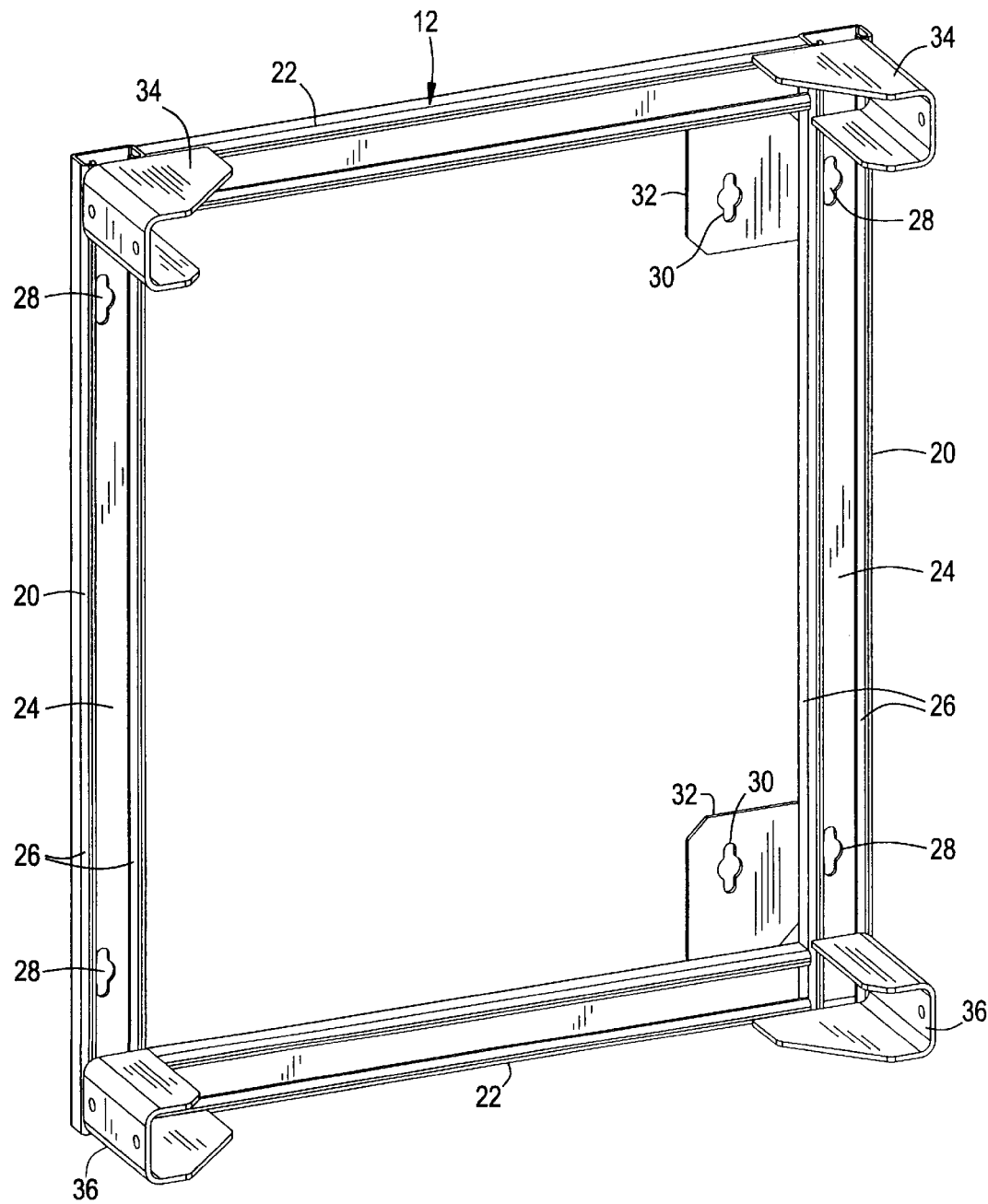
FIG. 2 is a perspective view of a back frame of the relay rack.

The back frame 12, shown in FIG. 2, is generally rectangular and designed to be mounted flat against a wall. It comprises two vertical members 20 and two horizontal members 22 attached together as by welding at intersections. The back frame 12 is preferably formed from bar stock of generally channel shape in transverse section, having a web 24 and opposing side flanges 26. The flanges 26 have inwardly-turned, hook-shaped lips that are engageable by a channel fastener (not shown) used for securing an object to the back frame 12 at a selected position along the back frame. Suitable channel fasteners are described in co-assigned U.S. Pat. Nos. 4,146,074, 4,460,299, and 5,209,619. The two vertical members 20 of the back frame 12 have slotted holes 28 in the webs 24 of the channels suitable for engagement by fasteners to attach the back frame against the wall. Additional slotted holes 30 are located in corner plates 32 attached to the back frame 12.

Two upper gussets 34 and two lower gussets 36 are affixed as by welding to the back frame 12 generally at the intersections of the vertical members 20 and horizontal members 22 of the back frame. Each gusset 34, 36 is shaped in the form of a channel bracket and is configured to be engageable by either the top frame 14 or bottom frame 16.

Figure 3:
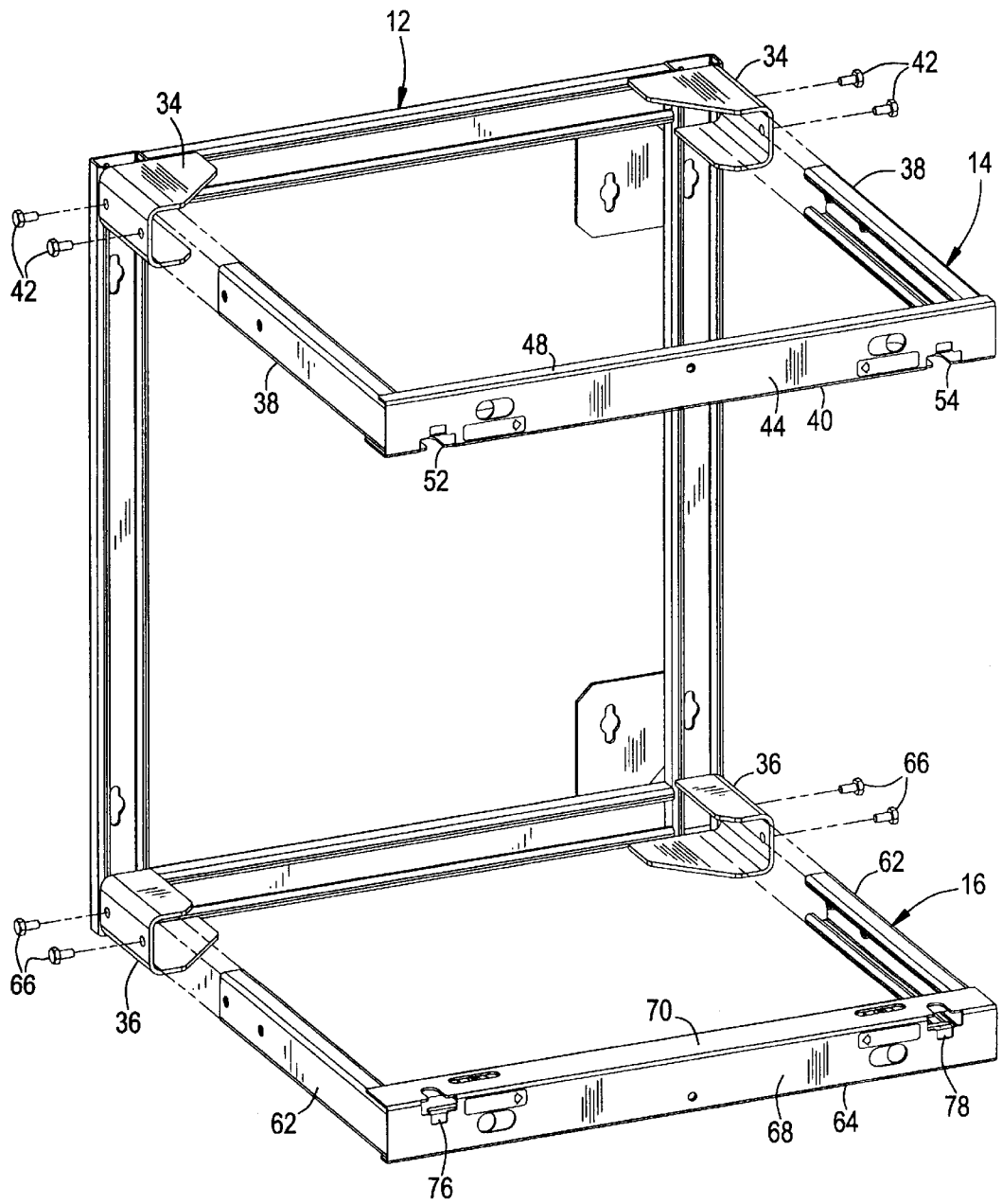
FIG. 3 is a partially exploded perspective view of a top frame, a bottom frame, and the back frame.
Figure 8:
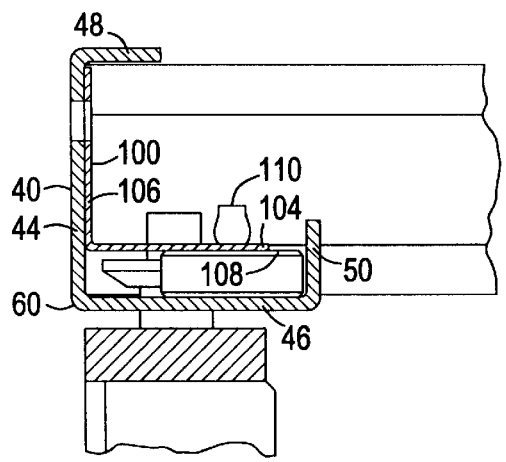
FIG. 8 is a sectional elevational view taken on line 8—8 of FIG. 6.
Figure 9:
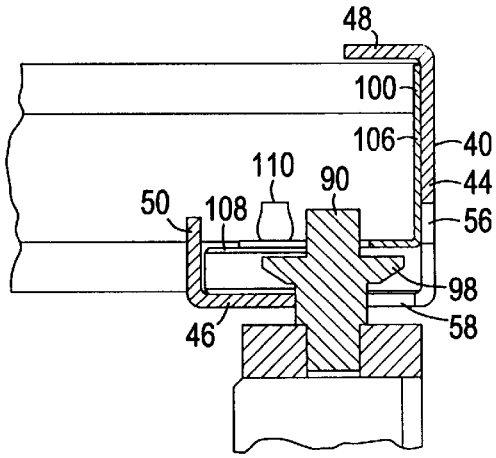
FIG. 9 is a sectional elevational view taken on line 9—9 of FIG. 6.

The top frame 14 comprises left and right top side frame members 38 that extend forward from the back frame 12, and a top front frame member 40 extending between the two top side frame members at the front of the rack 10. The left and right top side frame members 38 are formed of bar stock and are removably fastened, as by bolt or screw fasteners 42, to the upper gussets 34 as shown in FIG. 3. The frame member 40 is attached as by welding to the left and right top side frame members 38. As shown in FIGS. 8 and 9, the top front frame member 40 is an angle bar of generally L-shape in transverse section, having a front vertical leg 44 and a bottom horizontal leg 46. The front vertical leg 44 forms a front face of the rack's top frame 14. An upper portion of the vertical leg 44 is bent to form a rearwardly extending top horizontal flange 48 which runs between the two top side frame members 38, and a rearward portion of the horizontal leg 46 is bent up to form a vertical flange 50 spaced from the vertical leg and extending between the two top side frame members.

Figure 5:
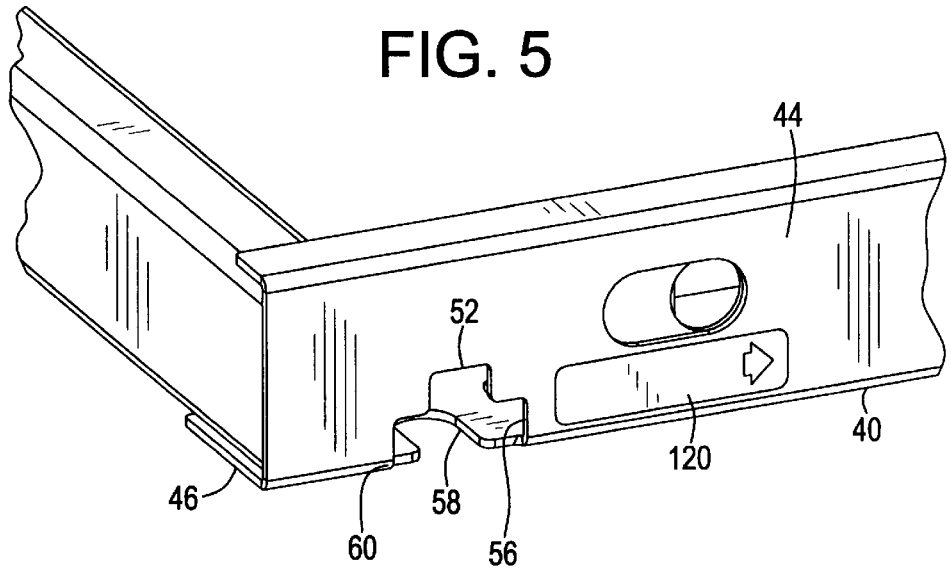
FIG. 5 is an enlarged perspective view of a portion of the top frame illustrating a recess and a finger hole in a horizontal slot.

An upper left recess 52 and an upper right recess 54 are formed in the top front frame member 40 generally adjacent its left and right ends, respectively. Each recess 52, 54 comprises the combination of a vertical slot 56 (FIG. 5) in the front vertical leg 44 and a horizontal slot 58 in the bottom horizontal leg 46. The slots 56, 58 are aligned and joined at a vertex 60 of the L shape of the top front frame member 40.

Figure 10:
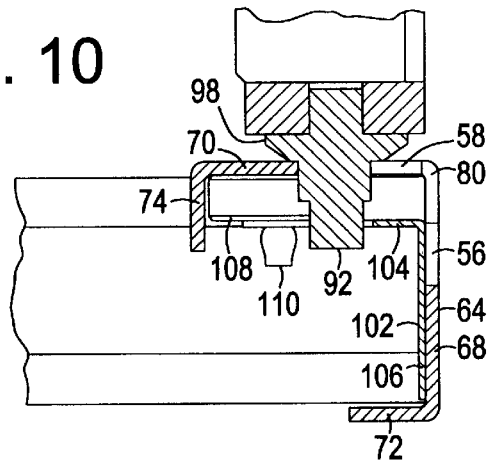
FIG. 10 is a sectional elevational view taken on line 10—10 of FIG. 7.

The bottom frame 16 comprises left and right bottom side frame members 62 that extend forward from the back frame 12, and a bottom front frame member 64 extending between the two bottom side frame members at the front of the rack 10. The left and right bottom side frame members 62 are formed of bar stock and are removably fastened, as by bolt or screw fasteners 66, to the lower gussets 36. As shown in FIG. 10, the bottom front frame member 64 is an angle bar of generally L-shape in transverse section, having a front vertical leg 68 and a top horizontal leg 70, and it is attached as by welding to the bottom side frame members 62. The front vertical leg 68 forms a front face of the rack's bottom frame 16. A lower portion of the vertical leg 68 is bent to form a rearwardly extending bottom horizontal flange 72 which runs between the two bottom side frame members 62, and a rearward portion of the horizontal leg 70 is bent down to form a vertical flange 74 spaced from the vertical leg and extending between the two bottom side frame members.

A lower left recess 76 and a lower right recess 78 are formed in the bottom front frame member 64 generally adjacent its left and right ends, respectively. Each recess 76, 78 comprises a combination of a vertical slot 56 in the front vertical leg 68 and a horizontal slot 58 in the top horizontal leg 70. The slots are aligned and joined at a vertex 80 of the L shape of the bottom front frame member 64.

Figure 4:
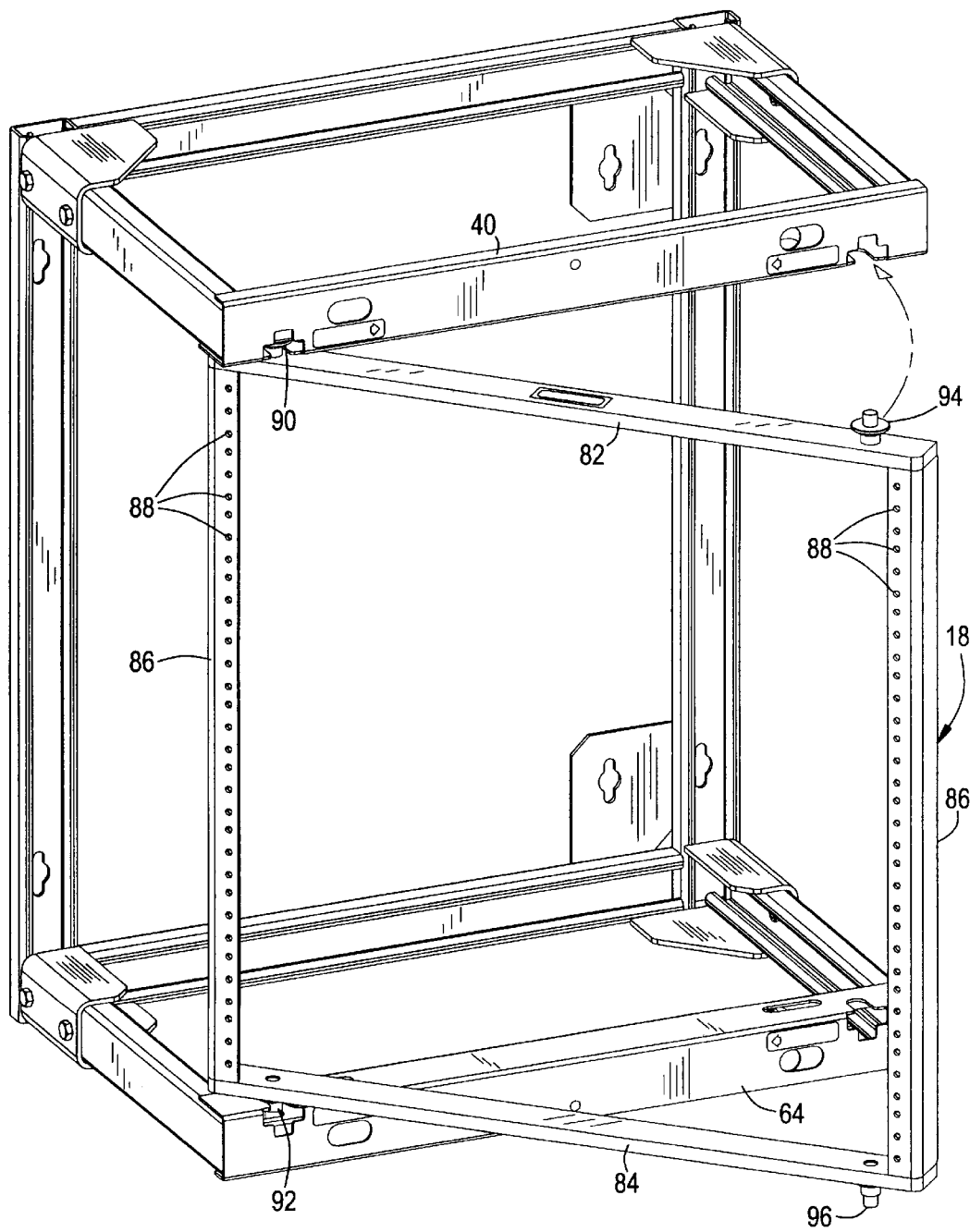
FIG. 4 is a perspective view of the relay rack with the door frame being shown swung open about a left vertical pivot axis.

The door frame 18, or gate, is generally rectangular and detachably mounted on the top front frame member 40 and bottom front frame member 64, as shown in FIG. 4. The door frame 18 comprises a top door frame member 82, a bottom door frame member 84, and a pair of upright side door frame members 86 adjacent the left and right sides of the door frame. In the preferred embodiment, the top and bottom door frame members 82, 84 are formed of rectangular section bars and the upright side door frame members 86 are formed of L-section bars, although frame members formed of other shapes are envisioned to be within the scope of this invention. Apertures 88 are provided in front flanges of the upright side door frame members 86 for mounting circuit boards, patch panels, and the like on the door frame 18.

An upper left pivot pin 90 and a lower left pivot pin 92 on the top and bottom door frame members 82, 84, respectively, define a left vertical pivot axis generally adjacent a left side of the door frame 18. An upper right pivot pin 94 and a lower right pivot pin 96 on the top and bottom door frame members 82, 84, shown in FIG. 4, define a right vertical pivot axis generally adjacent a right side of the door frame 18. The upper pivot pins 90, 94 extend up from the top door frame member 82, and the lower pivot pins 92, 96 extend down from the bottom door frame member 84. The pivot pins (90, 92, 94, and 96) are affixed as by welding to the door frame 18, and they are located and sized to be received within respective recesses (52, 76, 54, and 78) in the top and bottom front frame members 40, 64. As illustrated in FIGS. 9 and 10, each pivot pin is shaped generally as a cylinder having a vertical longitudinal axis and a horizontal flange 98. The upper and lower pivot pins are substantially the same to provide for common manufacture and part interchangeability. The horizontal flange 98 on each of the lower pivot pins 92, 96 comprises a load-bearing formation engageable with the bottom front frame member 64, as shown in FIG. 10, to bear generally vertical loads to support the weight of the door frame 18. For heavier door applications, the horizontal flange 98 on each of the upper pivot pins 90, 94 may also be load-bearing. Pivot pins of other shapes are envisioned to be within the scope of this invention, including differently shaped upper and lower pivot pins.

An upper latching bar 100 is mounted immediately to the rear of the top front frame member 40, as shown in FIG. 11, for sliding movement to the left and to the right relative to the top front frame member. Similarly, a lower latching bar 102 is mounted to the rear of the bottom front frame member 64 for sliding movement to the left and to the right relative to the bottom front frame member. Each latching bar 100, 102 is generally L-shaped in transverse section, having a horizontal flange 104 and a vertical flange 106, and each is sized to nest within a respective top or bottom front frame member 40, 64 as shown in FIGS. 8 and 10. Two spacers 108 are fixedly attached to each latching bar 100,102 as by a rivet type fastener 110. The spacers 108 are made of a low-friction material, and they position the latching bar at a fixed spaced relation from the horizontal leg 46, 70 of the respective top or bottom front frame member 40, 64. The spacers 108 slide with the latching bars and, as can be seen in FIG. 11, have a curved external shape. The legs and flanges (44, 46, 48, and 50 or alternatively 68, 70, 72, and 74) of the top and bottom front frame members 40, 64 respectively, function to support, generally enclose and thereby contain respective upper and lower latching bars 100, 102 and attached spacers 108. Each latching bar has a length somewhat less than the length of the corresponding front frame member as shown in FIG. 11. Notches 112 are formed in the horizontal flange 104 at ends of each latching bar 100, 102 for receiving respective pivot pins (90, 92, 94, or 96) on the door frame 18. The pivot pins extend up through these notches 112.

The upper and lower latching bars 100, 102 are each slidable from a home or neutral position (FIG. 11) in which they hold both the left and right pivot pins captive in their respective recesses to lock the door closed, to a left position (FIG. 13) in which the latching bars release the right pivot pins 94, 96 from their respective right recesses 54, 78 so the door frame 18 can be swung open and closed about the left vertical pivot axis, and to a right position (FIG. 12) in which the latching bars release the left pivot pins 90, 92 from their respective left recesses 52, 76 so the door frame can be swung open and closed about the right vertical pivot axis. In the home position, the ends of the latching bar 100 or 102 cover both the left and right recesses, the pivot pins being held captive in the recesses behind the latching bar (FIGS. 9 and 11). In the left position, the left end of the latching bar 100 or 102 holds captive the left pivot pin 90 or 92, and the right end of the latching bar shifts to the left of the right recess 54 or 78, thereby opening the right recess so that the right pivot pin 94 or 96 is free to move out of its recess. In the right position, the right end of the latching bar 100 or 102 holds captive the right pivot pin 94 or 96, and the left end of the latching bar shifts to the right of the left recess 52 or 76, thereby opening the left recess so that the left pivot pin 90 or 92 is free to move out of its recess.

Significantly, the latching bars 100 and 102 are the only parts of the rack 10 that are moveable for holding or releasing the left and right pivot pins from their respective recesses and permitting the left or right sides of the door frame 18 to be swung open.

Referring to FIGS. 6 and 7, left generally horizontal slots 114 and right generally horizontal slots 115 are located in the front vertical leg 44 of the top front frame member 40 and the front vertical leg 68 of the bottom front frame member 64. Left finger openings, or holes, 116 and right finger holes 118 are located in the upper latching bar 100 for moving or pushing the upper latching bar back and forth between home, left, and right positions. Similarly, left and right finger holes 116, 118 are located in the lower latching bar 102 for moving the lower latching bar back and forth between home, left, and right positions. The left and right finger holes 116, 118 in the latching bars are accessible by reaching through respective left and right slots 114, 115 in the top and bottom front frame members. To improve user safety, a protective finger cup (not shown) may be inserted in each finger hole 116 or 118 for smoothing an edge of the hole and limiting an extent to which a finger may be inserted in the hole. A directional label 120 is provided adjacent each finger hole 116, 118 for instruction on a direction to slide the latching bar 100 or 102 for selectively releasing the left or right side of the door frame 18.

Figure 14:
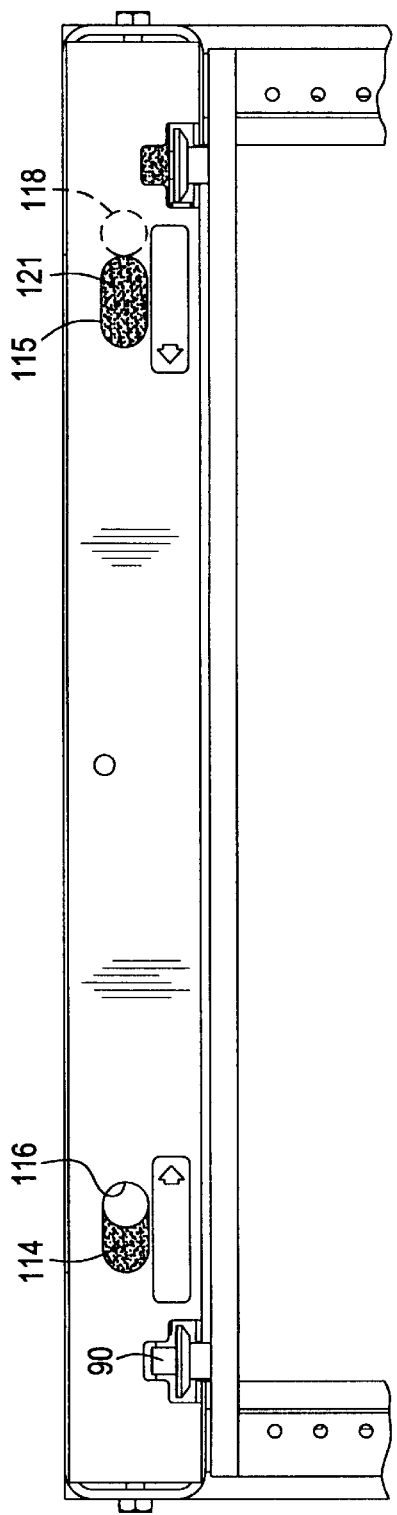
FIG. 14 is a front elevational view of the relay rack showing a top front frame member of the top frame with a right hand finger hole moved out of registration with a corresponding slot.

The slots 114, 115 and finger holes 116, 118 are so configured and positioned relative to one another that accidental simultaneous release of both left and right hand sides of the door frame 18 from the rack 10 is prevented. When the latching bars 100 and 102 are in their home positions, the left finger holes 116 are at left extremities of respective left slots 114 and the right finger holes 118 are at right extremities of the respective right slots 115 (FIG. 6 or 7). To move the latching bars 100, 102 to the right position, only the left finger holes 116 may be used because when the latching bars are slid from the home position toward the right, the right finger holes 118 move out of registration with the respective right slots 115 as seen in FIG. 14, leaving a solid surface 121 of the latching bar in registry with the right slots. The solid surface is not useable for sliding the latching bar. As a result, the right slots 115 cannot be used for accessing or sliding the latching bars 100 or 102 when the bars are at the right position and the left pivot pins 90, 92 are released. To move the latching bars back to the left, the left finger holes 116 must be used to slide the bars leftward to the home position, bringing the right finger holes 118 back into registration with the right slots 115. Then, the right finger holes 118 must be used to slide the latching bars 100 or 102 to the left position which causes the left finger holes 116 to move out of registration with the respective left slots 114.

Thus there is a multi-step process that requires at least three successive sliding motions of the latching bars 100 and 102 from different finger holes and slots in order to simultaneously release both sides of the door frame 18 from the rack 10. It is highly unlikely that the steps could be taken accidentally. Consequently, inadvertent release of the left pivot pins 90 and 92 from their respective recesses 52 and 76 when the door is swung open about the left pivot axis is prevented, and inadvertent release of the right pivot pins 94 and 96 from their respective recesses 54 and 78 when the door is swung open about the right pivot axis is prevented.

The relay rack 10 is efficiently expandable or contractible in capacity without disconnecting any electronic components or interrupting their operation and without dismounting the back frame 12 from the wall on which the rack is mounted. The relay rack 10 has a front-to-back dimension, constituting the depth of the rack, determined by the length of the top and bottom side frame members 38, 62 of the top and bottom frames 14,16. As shown in FIG. 3, the top and bottom frames 14, 16 are releasably fastened to the back frame 12 at the gussets 34, 36 to permit removal and replacement by different top and bottom frames having top and bottom side frame members 38, 62 of a selected length whereby the depth of the rack may be readily changed without replacing the back frame or the door frame 18.

Figure 17:
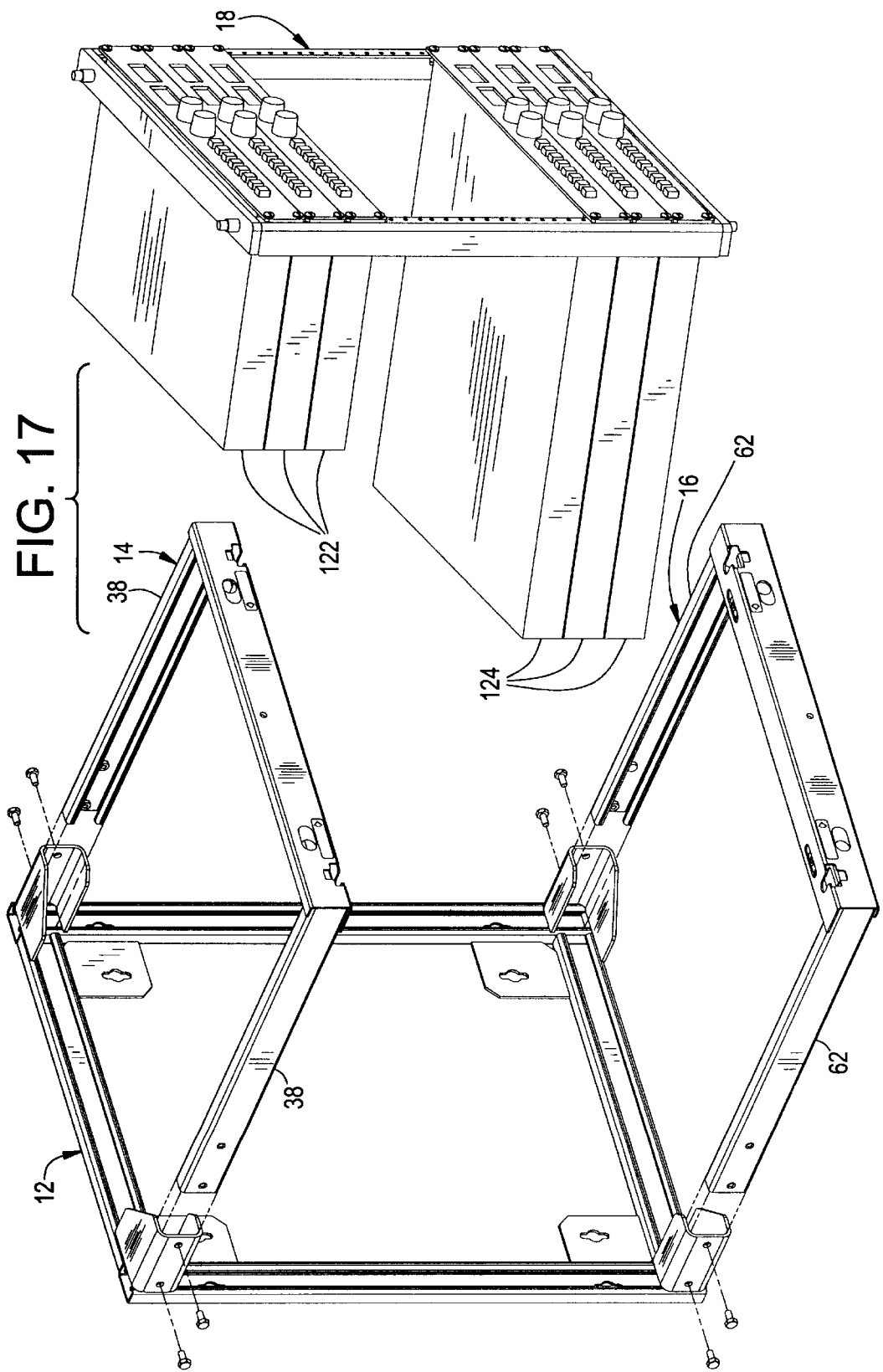
Figure 18:
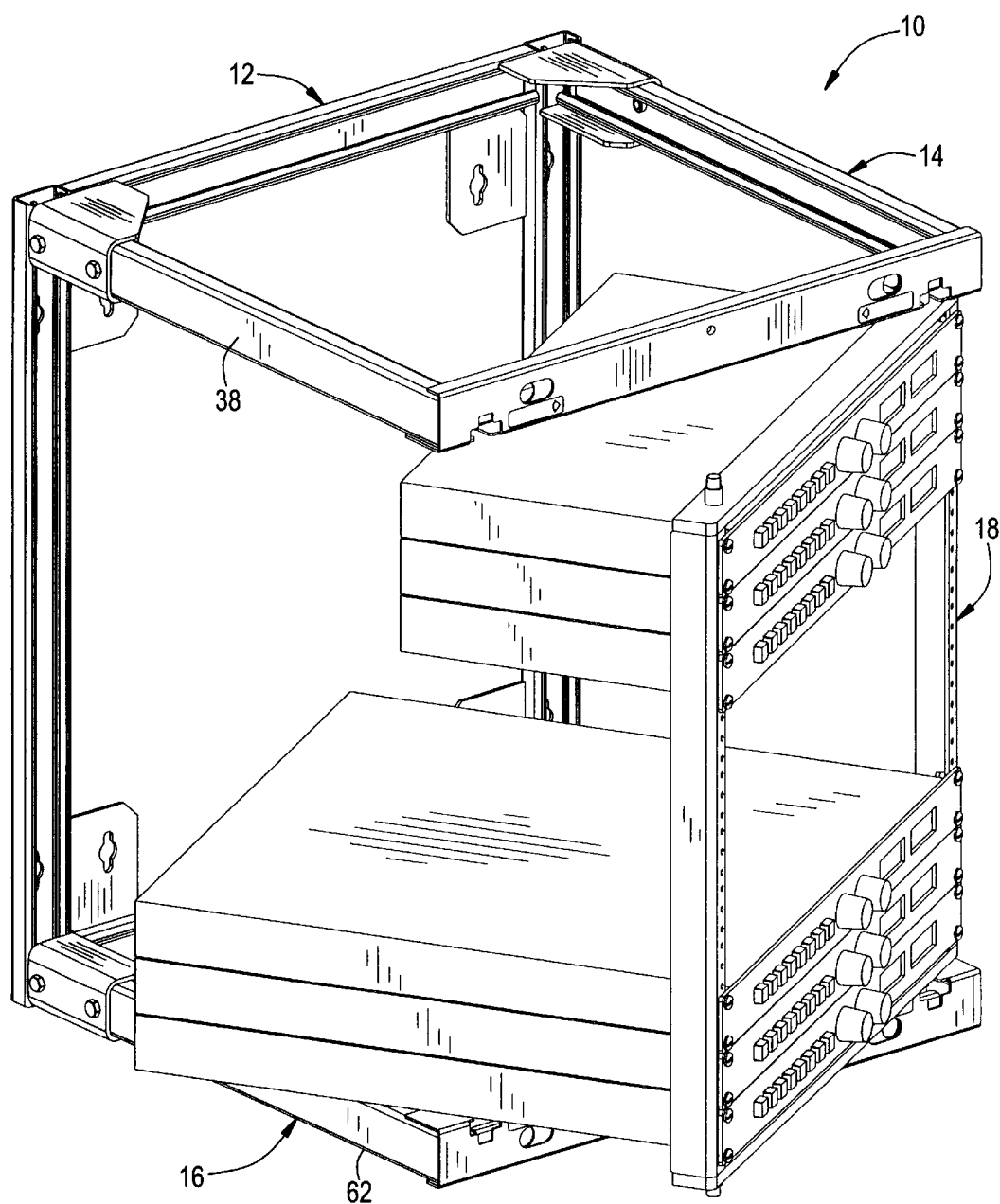

A method of changing the depth of a relay rack 10 mounted on a wall without disconnecting wiring of system components carried by the rack involves a series of simple steps, generally illustrated in FIGS. 15 through 18. The first step involves removing the door frame 18 without disconnecting wiring and without removing the back frame 12 from the wall. Accordingly, the door frame 18 with attached electronic components 122 is pivotally opened about one vertical pivot axis (FIG. 15), and the latching bars 100, 102 are moved to free the pivot pins defining the vertical axis so that the door frame may be removed. The removed door frame 18 is then placed in a position adjacent the rack 10 (FIG. 16), as permitted by available lengths of wiring (not shown). After the door frame 18 has been removed, the top and bottom frames 14 and 16 are removed from the back frame 12 and replacement top and bottom frames are attached to the back frame, the replacement frames having side frame members 38, 62 of a length corresponding to a desired new depth of the rack 10 (FIG. 17). Additional electronic components 124 having a different depth may be installed on the door frame 18 while it is removed, or may be installed later. The final step in the process is to remount the door frame 18 on the replacement top and bottom frames 14, 16 (FIG. 18).

Figure 19:
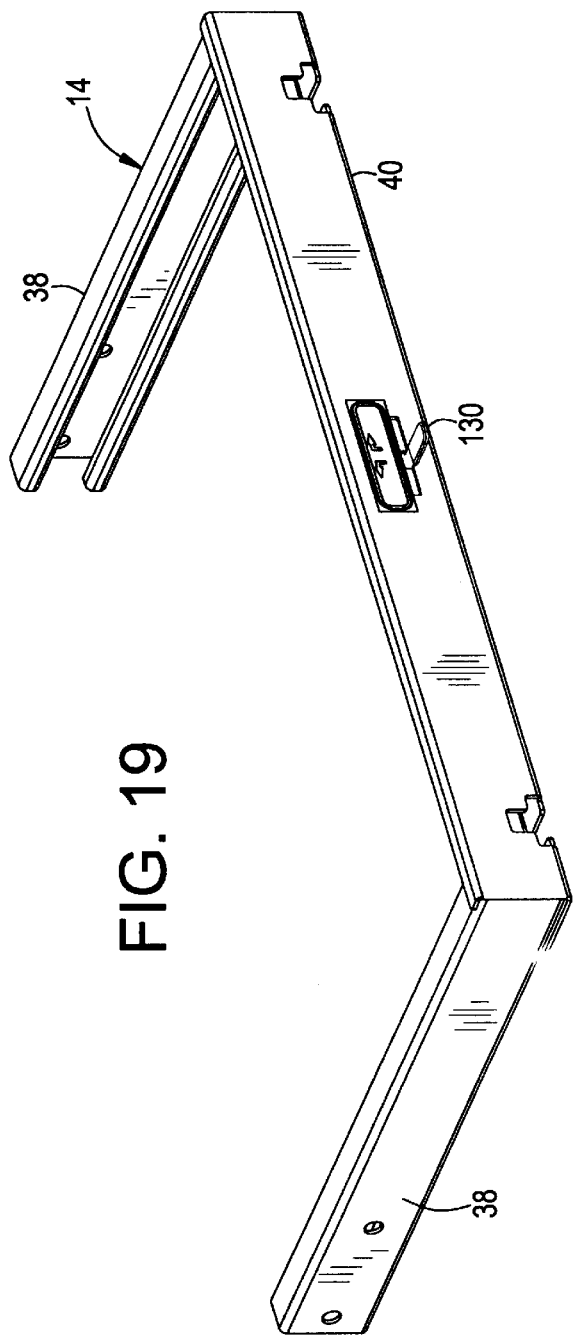
FIG. 19 is a perspective view of a second embodiment of a top frame of the relay rack of the present invention.
Figure 15:
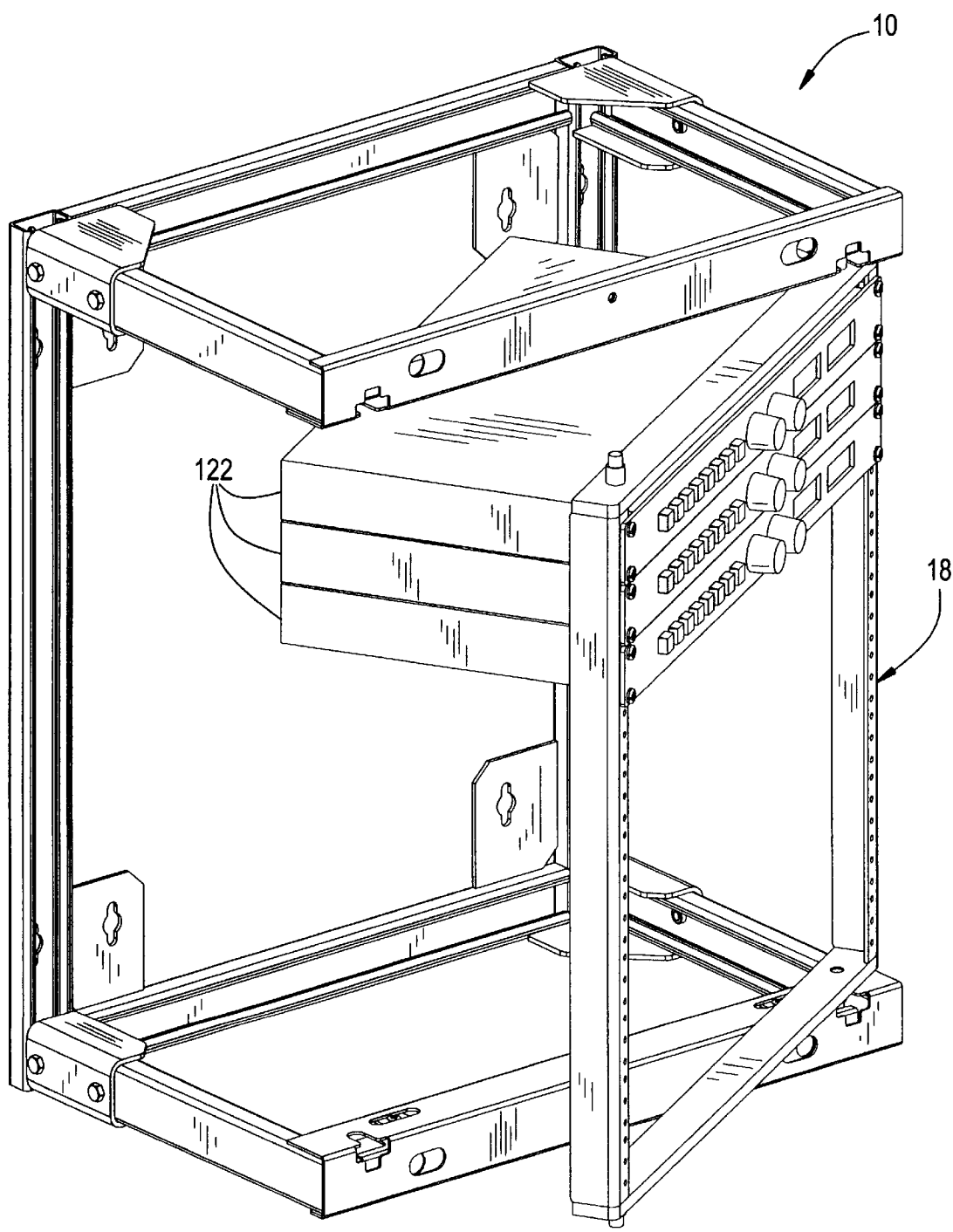
FIGS. 15–18 are perspective views of the relay rack illustrating a method of changing the depth of the rack.
Figure 16:
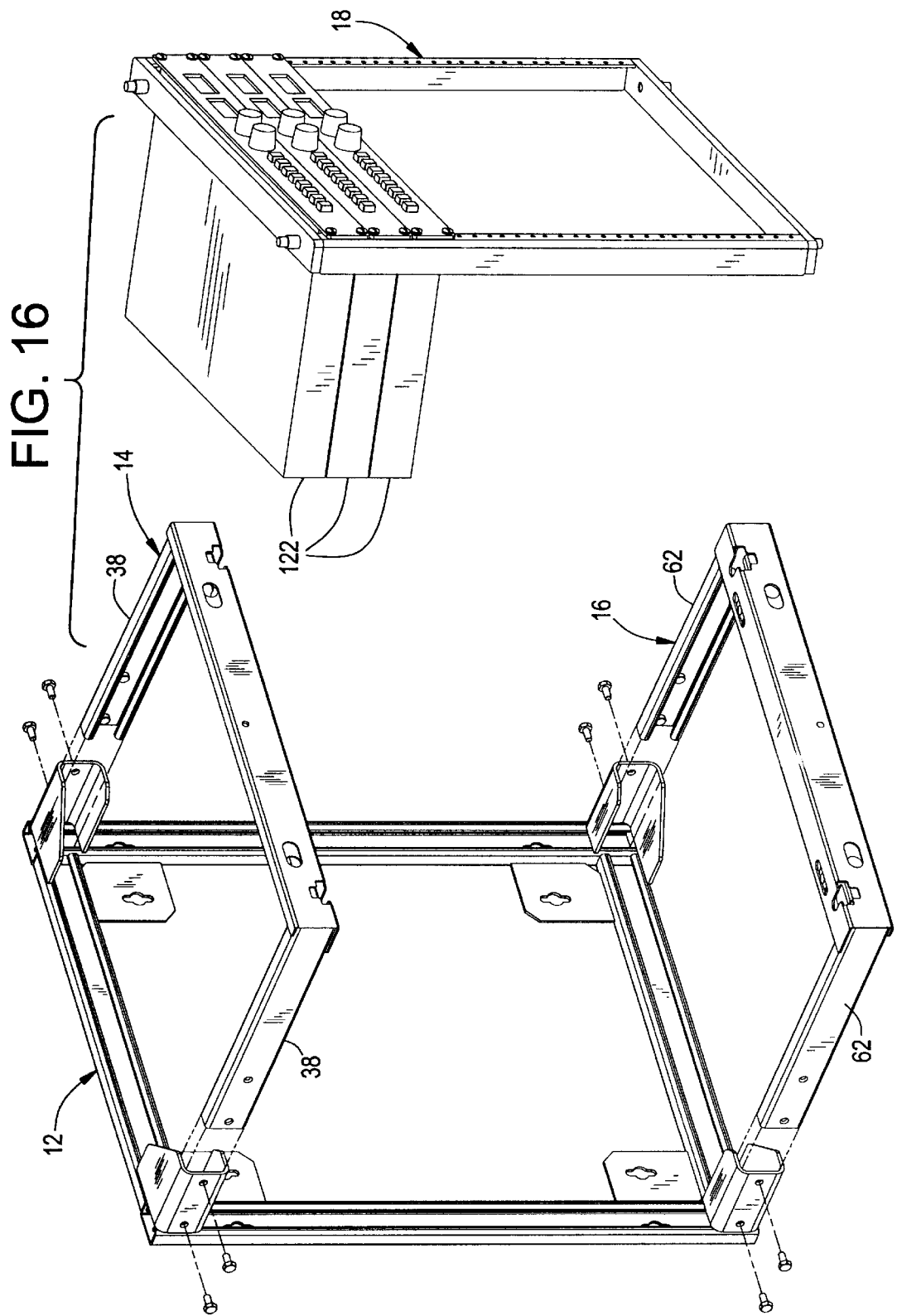

The top frame 14 of a second embodiment of the relay rack 10 is shown in FIG. 19. In this embodiment, a lever 130 is used instead of finger holes for moving or pushing each latching bar 100, 102. The lever 130 is fixedly attached near the center of each latching bar 100, 102 and projects forward through a slot in the bars so that it functions as a handle for pushing each latching bar back and forth between home, left, and right positions.

In view of the above, it will be seen that the several objects of the invention are achieved and other advantageous results obtained.

As various changes could be made in the above without departing from the scope of the invention, it is intended that all matter contained in the above description and shown in the accompanying drawings shall be interpreted as illustrative and not in a limiting sense.

What is claimed is:
1. A relay rack comprising:
   a top frame comprising a top front frame member;
   a bottom frame comprising a bottom front frame member;
   a generally rectangular door frame comprising a top door frame member, a bottom door frame member and a pair of upright side door frame members adjacent left and right sides of the door frame;
   upper and lower left pivot pins on the top and bottom door frame members defining a left vertical pivot axis generally adjacent the left side of the door frame, and upper and lower right pivot pins on the top and bottom frame members of the door frame defining a right vertical pivot axis generally adjacent the right side of the door frame;
   upper and lower left recesses in the top and bottom front frame members for receiving said upper and lower left pivot pins,
   upper and lower right recesses in the top and bottom front frame members for receiving said upper and lower right pivot pins;
   an upper latching bar mounted to the rear of the top front frame member for sliding movement to the left and to the right relative to the top front frame member; and
   a lower latching bar mounted immediately to the rear of the bottom front frame member for sliding movement to the left and to the right relative to the bottom front frame member;
   the upper and lower latching bars being slidable from a home position in which they hold the left and right pivot pins captive in their respective recesses to lock the door closed, to a left position in which the latching bars release the right pivot pins from their respective right recesses so the door frame can be swung open and closed about said left vertical pivot axis, and to a right position in which the latching bars release the left pivot pins from their respective left recesses so the door frame can be swung open and closed about said right vertical pivot axis.

2. A relay rack as set forth in claim 1 further comprising left and right generally horizontal slots in the top front frame member, left and right generally horizontal slots in the bottom front frame member, left and right finger holes in the upper latching bar for moving the upper latching bar back and forth between said home, left and right positions, and left and right finger holes in the lower latching bar from moving the lower latching bar back and forth between said home, left and right positions, the left and right finger holes in the latching bars being accessible by reaching through respective left and right slots in respective top and bottom front frame members.

3. A relay rack as set forth in claim 2 wherein said slots and finger holes are so configured and positioned relative to one another that when the latching bars are in said home position the left finger openings are at left extremities of respective left slots and the right finger openings are at right extremities of respective right slots whereby using the left finger holes to move the latching bars from said home position to said right position causes the right finger holes to move out of registration with respective right slots, thereby preventing inadvertent release of the right pivot pins from their respective recesses when the door is swung open about said right vertical pivot axis, and using the right finger holes to move the latching bars from said home position to said left position causes the left finger holes to move out of registration with respective left slots, thereby preventing inadvertent release of the left pivot pins from their respective recesses when the door is swung open about said left vertical pivot axis.

4. A relay rack as set forth in claim 3 wherein each front frame member of the top and bottom frame comprises a channel-shaped rail having a generally vertical front web and upper and lower flanges extending rearwardly from the front web, said recesses in the top front frame member comprising left and right slots in the lower flange of the channel-shaped rail and left and right openings in the web of the rail for permitting passage of the upper left and right pivot pins through the web into respective left and right slots, and said recesses in the bottom front frame member comprising left and right slots in the upper flange of the channel-shaped rail and left and right openings in the web of the rail for permitting passage of the lower left and right pivot pins through the web into respective left and right slots.

5. A relay rack as set forth in claim 1 wherein said upper pivot pins extend up from the top door frame member and the lower pivot pins extend down from the bottom door frame member.

6. A relay rack as set forth in claim 5 wherein each of the lower pivot pins has a load-bearing formation thereon engageable with said bottom front frame member for supporting the vertical load of the door frame when the door frame is open.

7. A relay rack as set forth in claim 1 further comprising an upright back frame, said top frame and said bottom frame each being generally U-shaped and extending forward from the back frame, said top frame comprising left and right top side frame members extending forward from the back frame and being connected at forward ends thereof by said top front frame member, and said bottom frame comprising left and right bottom side frame members extending forward from the back frame and being connected at forward ends thereof by said bottom front frame member.

8. A relay rack as set forth in claim 7 wherein said back frame and the left and right side frame members of the top frame and bottom frame are formed from bar stock of generally channel shape in transverse section, each of said frame members having a web and opposing side flanges with inwardly-turned, hook-shaped lips engageable by a channel fastener used for securing an object to said frame member at a selected position along the frame member.

9. A relay rack as set forth in claim 7 having a front-to-back dimension, constituting the depth of the rack, determined by the length of the left and right side frame members of the top and bottom frames, said top and bottom frames being releasably fastened to the back frame to permit removal and replacement by replacement top and bottom frames having left and right side frame members of a selected length whereby the depth of the rack may be readily changed without replacing the back frame or the door frame.

10. A relay rack as set forth in claim 9 in combination with said replacement top and bottom frames.

11. A relay rack comprising:
an upright back frame;
a generally U-shaped top frame extending forward from the back frame, said top frame comprising left and right top side frame members extending forward from the back frame, and a top front frame member extending between the two top side frame members at the front of the rack;
a generally U-shaped bottom frame extending forward from the back frame, said bottom frame comprising left and right bottom side frame members extending forward from the back frame, and a bottom front frame member extending between the two bottom side frame members at the front of the rack;
a generally rectangular door frame comprising a top frame member, a bottom frame member and a pair of upright side frame members adjacent left and right sides of the door frame; and
pivot pins mounting the door frame on the top and bottom front frame members for swinging open and closed about a left vertical pivot axis generally adjacent the left side of the door frame and a right vertical pivot axis generally adjacent the right side of the door frame;
said relay rack having a front-to-back dimension, constituting a depth of the rack, determined by a length of the left and right side frame members of the top and bottom frames, said top and bottom frames being releasably fastened to the back frame to permit removal and replacement by different top and bottom frames having left and right side frame members of a selected length whereby the depth of the rack may be readily changed without replacing the back frame or the door frame.

12. A relay rack as set forth in claim 11 in combination with said different top and bottom frames.

13. A method of changing a depth of a relay rack mounted on a wall without disconnecting wiring of system components carried by the rack, said rack being of the type comprising (a) an upright back frame mounted on the wall, (b) a generally U-shaped top frame extending forward from the back frame, said top frame comprising left and right top side frame members extending forward from the back frame, and a top front frame member extending between the two top side frame members at the front of the rack, (c) a generally U-shaped bottom frame extending forward from the back frame, said bottom frame comprising left and right bottom side frame members extending forward from the back frame, and a bottom front frame member extending between the two bottom side frame members at the front of the rack, (d) a generally rectangular door frame removably mounted on the top and bottom front frame members for swinging open and closed about at least one vertical pivot axis, said top and bottom frames and said door frame carrying system components connected by wiring; said method comprising the following steps:
removing the door frame without disconnecting said wiring and without removing the back frame from the wall;

placing the removed door frame in a position adjacent the rack, as permitted by said wiring;

removing the top and bottom frames from the back frame;

attaching replacement top and bottom frames to the back frame, said replacement frames having side frame members of a length corresponding to a desired new depth of the rack; and remounting the door frame on the replacement top and bottom frames.

14. A method as set forth in claim 13 wherein said top and bottom frames are removably connected to said back frame by screw fasteners.

* * * * *